United States Patent
Kanno

(10) Patent No.: US 8,636,409 B2
(45) Date of Patent: Jan. 28, 2014

(54) HEAT TREATMENT APPARATUS AND TEMPERATURE MEASURING METHOD THEREOF

(75) Inventor: Soichi Kanno, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 162 days.

(21) Appl. No.: 13/399,421

(22) Filed: Feb. 17, 2012

(65) Prior Publication Data
US 2012/0213249 A1 Aug. 23, 2012

(30) Foreign Application Priority Data
Feb. 18, 2011 (JP) .................................. 2011-033419

(51) Int. Cl.
*G01K 7/00* (2006.01)
*G01K 3/00* (2006.01)
*G01K 13/00* (2006.01)

(52) U.S. Cl.
USPC ............ 374/179; 374/166; 374/112; 374/141

(58) Field of Classification Search
USPC .................................. 374/179, 166, 112, 141
See application file for complete search history.

(56) References Cited

U.S. PATENT DOCUMENTS

| | | | | |
|---|---|---|---|---|
| 4,440,509 A | * | 4/1984 | Agarwal | 374/166 |
| 4,483,631 A | * | 11/1984 | Kydd | 374/141 |
| 5,064,506 A | * | 11/1991 | Sparenberg et al. | 203/2 |
| 5,192,132 A | * | 3/1993 | Pelensky | 374/166 |
| 5,232,517 A | * | 8/1993 | Hilborn et al. | 136/233 |
| 5,258,601 A | * | 11/1993 | Takano | 219/486 |
| 5,431,495 A | * | 7/1995 | Hemsath | 374/15 |
| 5,875,416 A | * | 2/1999 | Kanno | 702/130 |
| 2002/0025688 A1 | * | 2/2002 | Kato | 438/758 |
| 2002/0182119 A1 | * | 12/2002 | Daily et al. | 422/119 |
| 2004/0004993 A1 | * | 1/2004 | Cho et al. | 374/163 |
| 2012/0064472 A1 | * | 3/2012 | Yoshii et al. | 432/42 |
| 2012/0231407 A1 | * | 9/2012 | Kadobe et al. | 432/247 |

FOREIGN PATENT DOCUMENTS

| | | |
|---|---|---|
| JP | 2002-305189 A | 10/2002 |
| JP | 2005-188869 A | 7/2005 |

* cited by examiner

*Primary Examiner* — Mirellys Jagan
(74) *Attorney, Agent, or Firm* — Nath, Goldberg & Meyer; Jerald L. Meyer

(57) ABSTRACT

A heat treatment apparatus includes: a furnace body including a heating part; a processing vessel wherein a space having a plurality of regions is formed between the furnace body and the processing vessel; an in-furnace temperature sensor disposed corresponding to each of the plurality of regions in the space; an in-furnace temperature calculating unit configured to calculate an in-furnace temperature based on signals from each of the in-furnace temperature sensors; and a control unit configured to control the heating part based on the in-furnace temperature calculated by the in-furnace temperature calculating unit. The in-furnace temperature sensor disposed in the reference region includes: a first thermocouple formed of an R thermocouple or an S thermocouple; and a second thermocouple formed of a thermocouple other than the R thermocouple or the S thermocouple. The in-furnace temperature sensor disposed in the other region includes the second thermocouple.

12 Claims, 5 Drawing Sheets

HEAT TREATMENT APPARATUS AND TEMPERATURE MEASURING METHOD THEREOF

CROSS-REFERENCE TO RELATED APPLICATION

This application claims the benefit of Japanese Patent Application No. 2011-33419, filed on Feb. 18, 2011, in the Japan Patent Office, the disclosure of which is incorporated herein in its entirety by reference.

TECHNICAL FIELD

The present disclosure relates to a heat treatment apparatus and a temperature measuring method thereof.

BACKGROUND

To manufacture semiconductor devices, various heat treatment apparatuses are used to perform heat treatment on an object to be processed, for example, a semiconductor wafer. The heat treatment includes oxidation, diffusion, Chemical Vapor Deposition (CVD), and annealing. For example, a vertical heat treatment apparatus may perform heat treatment on a plurality of wafers at one time. The vertical heat treatment apparatus includes: a processing vessel made of quartz that has an opening at a lower portion thereof; a cover that opens/closes the opening of the processing vessel; a retention device that is disposed on the cover and retains a plurality of the objects to be processed at certain intervals in a vertical direction; a furnace body that is disposed around the processing vessel; and a heater which heats the objects to be processed in the processing vessel.

Conventionally, in order to control the temperature in the furnace body with a high precision, a space in the furnace body is segmented into a plurality of regions, an in-furnace temperature sensor is disposed in each of the plurality of regions, and the temperature in each of the segmented regions is separately and carefully controlled by a heater.

Here, a K thermocouple or an R thermocouple is used as the in-furnace temperature sensor. In this case, when a measured temperature of the furnace body is greatly changed, a Seebeck coefficient (represents a degree of generation of an electromotive force relative to a change in temperature) of the K thermocouple is changed. That is, an electromotive force from the K thermocouple is required to be calibrated when the measured temperature is changed.

Further, even if the Seebeck coefficient of the R thermocouple or S thermocouple need not be changed, using the R thermocouple or the S thermocouple is expensive, thereby increasing the cost of manufacturing.

SUMMARY

It is an objective of the present disclosure to provide a heat treatment apparatus and a method of measuring a temperature thereof. The heat treatment apparatus includes a plurality of in-furnace temperature sensors having thermocouples. Further, the temperatures measured by the thermocouples do not need to be calibrated, thereby reducing a cost of installing.

According to one embodiment of the present disclosure, a heat treatment apparatus includes a furnace body including a heating part disposed at an inner circumference surface thereof; a processing vessel disposed in the furnace body, and configured to receive a plurality of objects to be processed, wherein a space having a plurality of regions is formed between the furnace body and the processing vessel; an in-furnace temperature sensor disposed corresponding to each of the plurality of regions in the space, wherein the plurality of regions includes a reference region and other region; an in-furnace temperature calculating unit configured to calculate an in-furnace temperature based on signals from each of the in-furnace temperature sensors; and a control unit configured to control the heating part based on the in-furnace temperature calculated by the in-furnace temperature calculating unit, wherein the in-furnace temperature sensor disposed in the reference region includes: a first thermocouple formed of an R thermocouple or an S thermocouple; and a second thermocouple formed of a thermocouple other than the R thermocouple or the S thermocouple, wherein the in-furnace temperature sensor disposed in the other region includes the second thermocouple, and the other region corresponds to the plurality of regions excluding the reference region, and wherein the in-furnace temperature calculating unit includes: an electromotive force difference circuit connected to the second thermocouple in the reference region and the second thermocouple in the other region, and configured to calculate a temperature difference between the reference region and the other region; a first thermocouple electromotive force measurement circuit connected to the first thermocouple in the reference region, and configured to calculate a temperature in the reference region based on a first signal from the first thermocouple; and an adder connected to the first thermocouple electromotive force measurement circuit and the electromotive force difference circuit corresponding to the other region, and configured to add a second signal from the first thermocouple electromotive force measurement circuit to a third signal from the electromotive force difference circuit to calculate a temperature in the other region.

According to another embodiment of the present disclosure, a heat treatment apparatus includes a furnace body including a heating part disposed at an inner circumference surface thereof; a processing vessel disposed in the furnace body, having a plurality of regions formed therein, and configured to receive a plurality of objects to be processed, wherein a space is formed between the furnace body and the processing vessel; an in-vessel temperature sensor disposed corresponding to each of the plurality of regions of the processing vessel, wherein the plurality of regions includes a reference region and other region; an in-vessel temperature calculating unit configured to calculate an in-vessel temperature based on signals from each of the in-vessel temperature sensors; and a control unit configured to control the heating part based on the in-vessel temperature calculated by the in-vessel temperature calculating unit, wherein the in-vessel temperature sensor disposed in the reference region of the processing vessel includes: a first thermocouple formed of an R thermocouple or an S thermocouple; and a second thermocouple formed of a thermocouple other than the R thermocouple or the S thermocouple, wherein the in-vessel temperature sensor disposed in the other region includes the second thermocouple, and the other region corresponds to the plurality of regions excluding the reference region, and wherein the in-vessel temperature calculating unit includes: an electromotive force difference circuit connected to the second thermocouple in the reference region and the second thermocouple in the other region, and configured to calculate a temperature difference between the reference region and the other region; a first thermocouple electromotive force measurement circuit connected to the first thermocouple in the reference region, and configured to calculate a temperature in the reference region based on a first signal from the first thermocouple; and an adder connected to the first thermocouple electromotive force measurement circuit and the electromotive force difference circuit corresponding to the other region and configured to add a second signal from the first thermocouple electromotive force measurement circuit to a third signal from the electromotive force difference circuit to calculate a temperature in the other region.

According an embodiment of the present disclosure, a temperature measuring method of a heat treatment apparatus includes receiving, via an in-furnace temperature calculating unit of the heat treatment apparatus, a plurality of signals from a plurality of in-furnace temperature sensors, wherein the plurality of in-furnace temperature sensors are disposed corresponding to a plurality of regions in a space formed between a furnace body and a processing vessel of the heat treatment apparatus, the plurality of regions includes a reference region and other region, the in-furnace temperature sensors disposed in the reference region includes a first thermocouple formed of an R thermocouple or a S thermocouple, and a second thermocouple formed of a thermocouple other than the R thermocouple or the S thermocouple, and the in-furnace temperature sensors disposed in the other region include the second thermocouple; calculating, via an electromotive force difference circuit of the in-furnace temperature calculating unit, a temperature difference between the reference region and the other region based on a first signal from the second thermocouple in the reference region and a second signal from the second thermocouple in the other region, and outputting a fourth signal based on the calculated temperature difference; calculating, via a first thermocouple electromotive force measurement circuit of the in-furnace temperature calculating unit, a temperature in the reference region based on a third signal from the first thermocouple in the reference region, and outputting a fifth signal based on the calculated temperature in the reference region; and receiving and adding, via an adder of the in-furnace temperature calculating unit, the fourth signal and the fifth signal to calculate a temperature in the other region.

According an embodiment of the present disclosure, a temperature measuring method of a heat treatment apparatus includes receiving, via an in-vessel temperature calculating unit of the heat treatment apparatus, a plurality of signals from a plurality of in-vessel temperature sensors, wherein the plurality of in-vessel temperature sensors are disposed corresponding to each of a plurality of regions of a processing vessel, and a space is formed between a furnace body and the processing vessel of the heat treatment apparatus, the plurality of regions includes a reference region and other region, an in-vessel temperature sensor disposed in the reference region includes a first thermocouple formed of an R thermocouple or a S thermocouple, and a second thermocouple formed of a thermocouple other than the R thermocouple or the S thermocouple, and an in-vessel temperature sensor disposed in the other region include the second thermocouple; calculating, via an electromotive force difference circuit of the in-vessel temperature calculating unit, a temperature difference between the reference region and the other region based on a first signal from the second thermocouple in the reference region and a second signal from the second thermocouple in the other region, and outputting a fourth signal based on the calculated temperature difference; calculating, via a first thermocouple electromotive force measurement circuit of the in-vessel temperature calculating unit, a temperature in the reference region based on a third signal from the first thermocouple in the reference region, and outputting a fifth signal based on the calculated temperature in the reference region; and receiving and adding, via an adder of the in-vessel temperature calculating unit, the fourth signal and the fifth signal to calculate a temperature in the other region.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

The accompanying drawings, which are incorporated in and constitute a part of the specification, illustrate embodiments of the present disclosure, and together with the general description given above and the detailed description of the embodiments given below, serve to explain the principles of the present disclosure.

Figure 2:
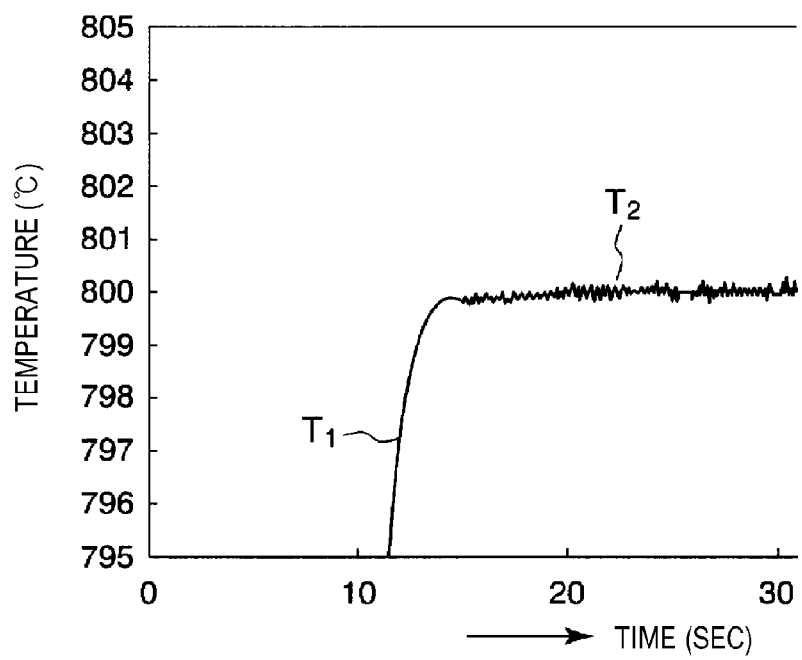

FIG. 2 illustrates a change of temperature in a furnace body with respect to a change in time according to some embodiments.

Figure 3:
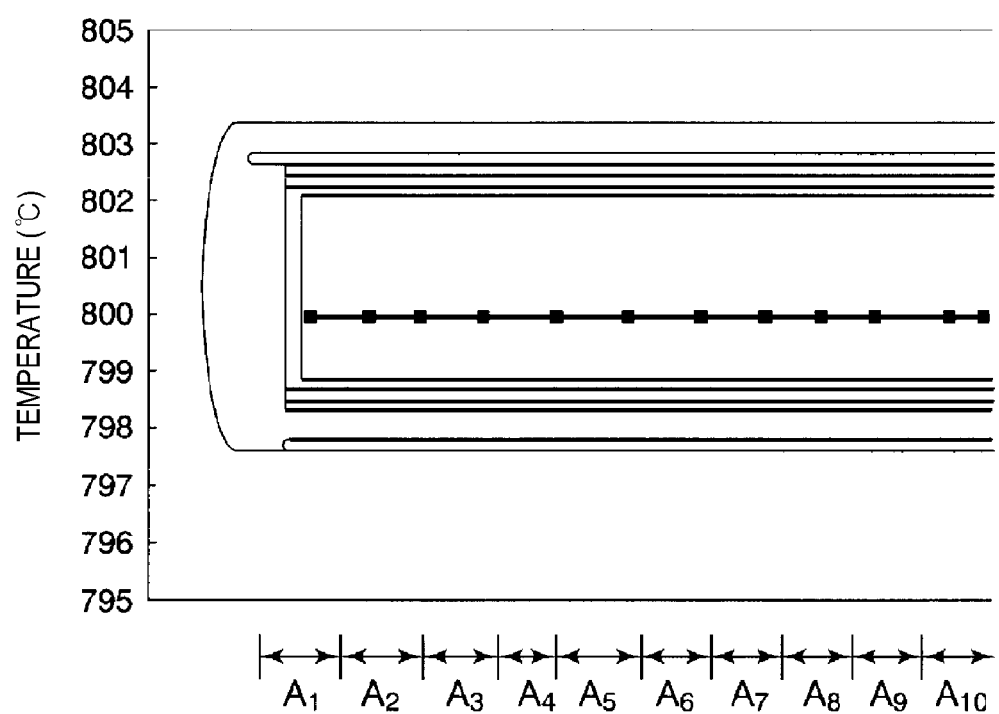

FIG. 3 schematically illustrates a temperature in each unit region of the furnace body according to some embodiments.

Figure 4:
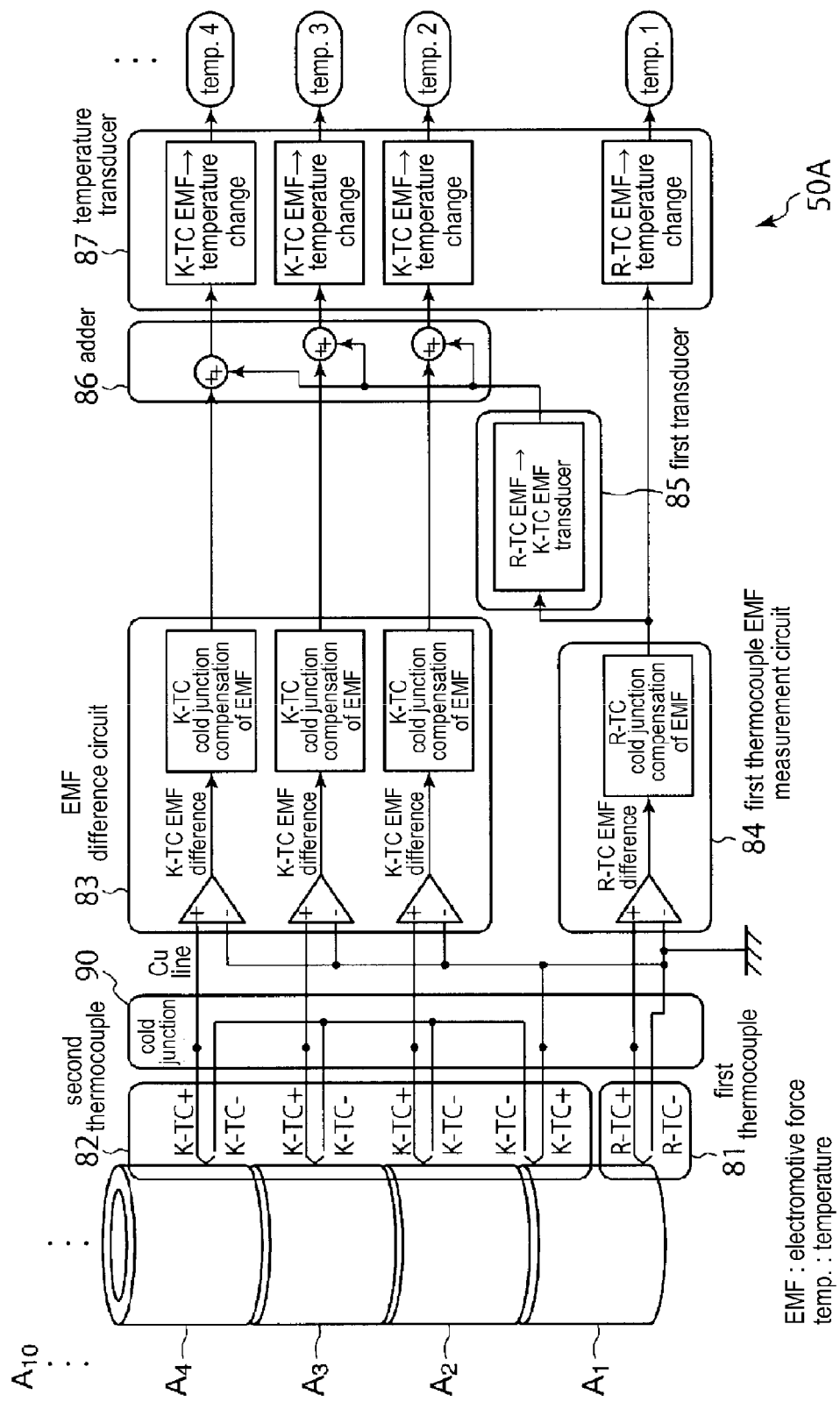

FIG. 4 illustrates a temperature calculating unit according to some embodiments.

Figure 5:
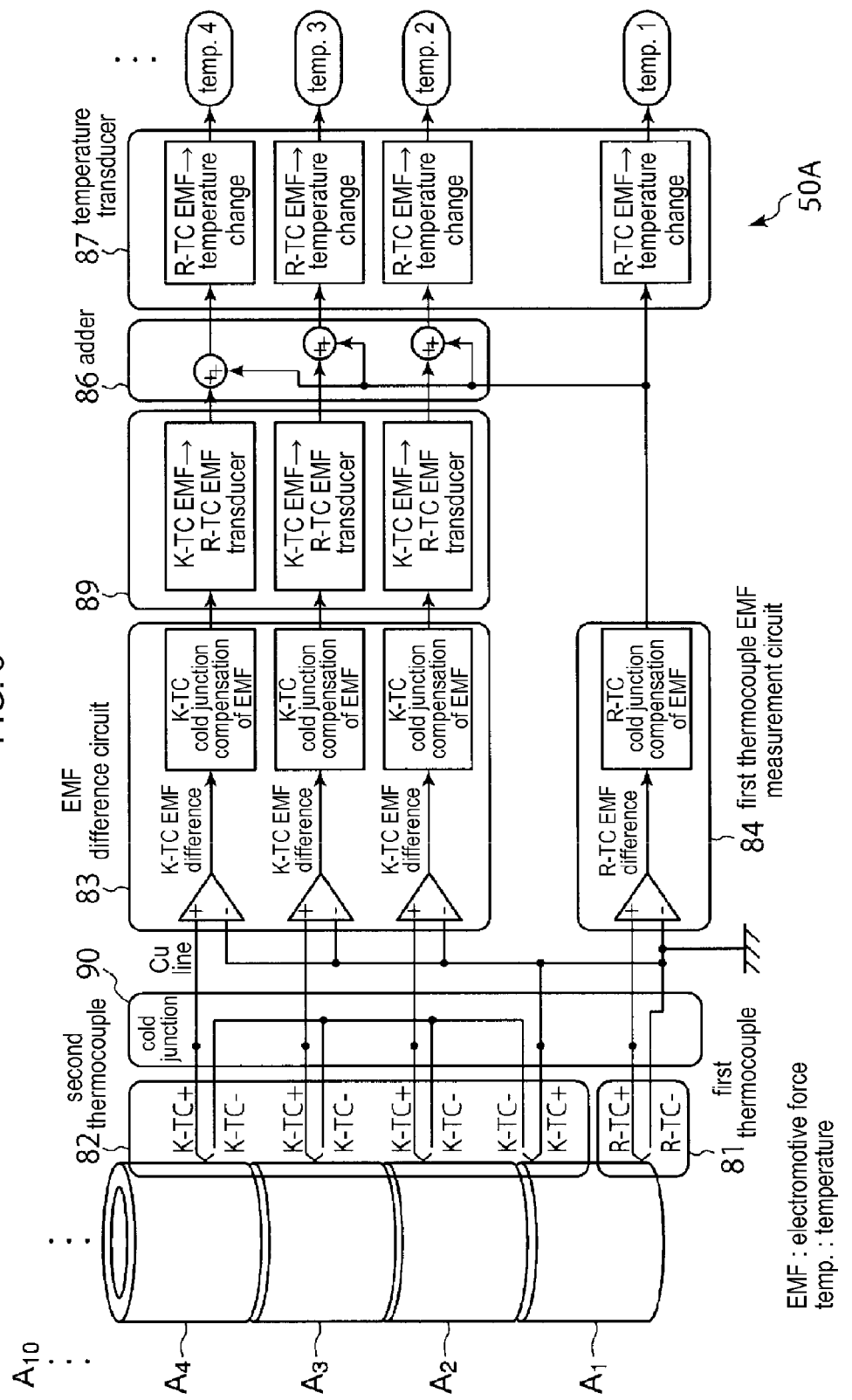

FIG. 5 illustrates a modified temperature calculating unit according to some embodiments.

Figure 6:
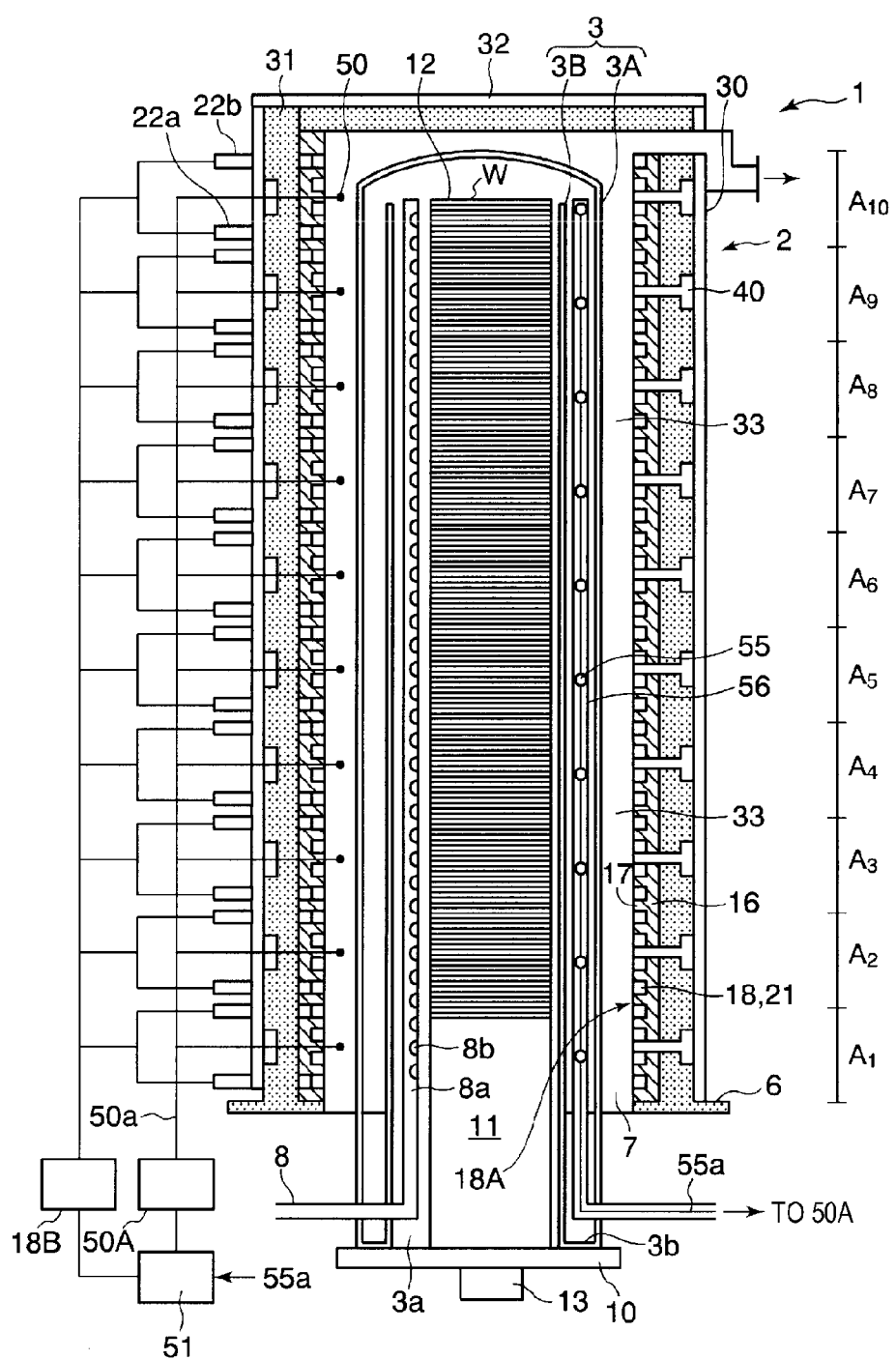

FIG. 6 is a longitudinal sectional view schematically illustrating a modified heat treatment apparatus according to some embodiments.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Figure 1:
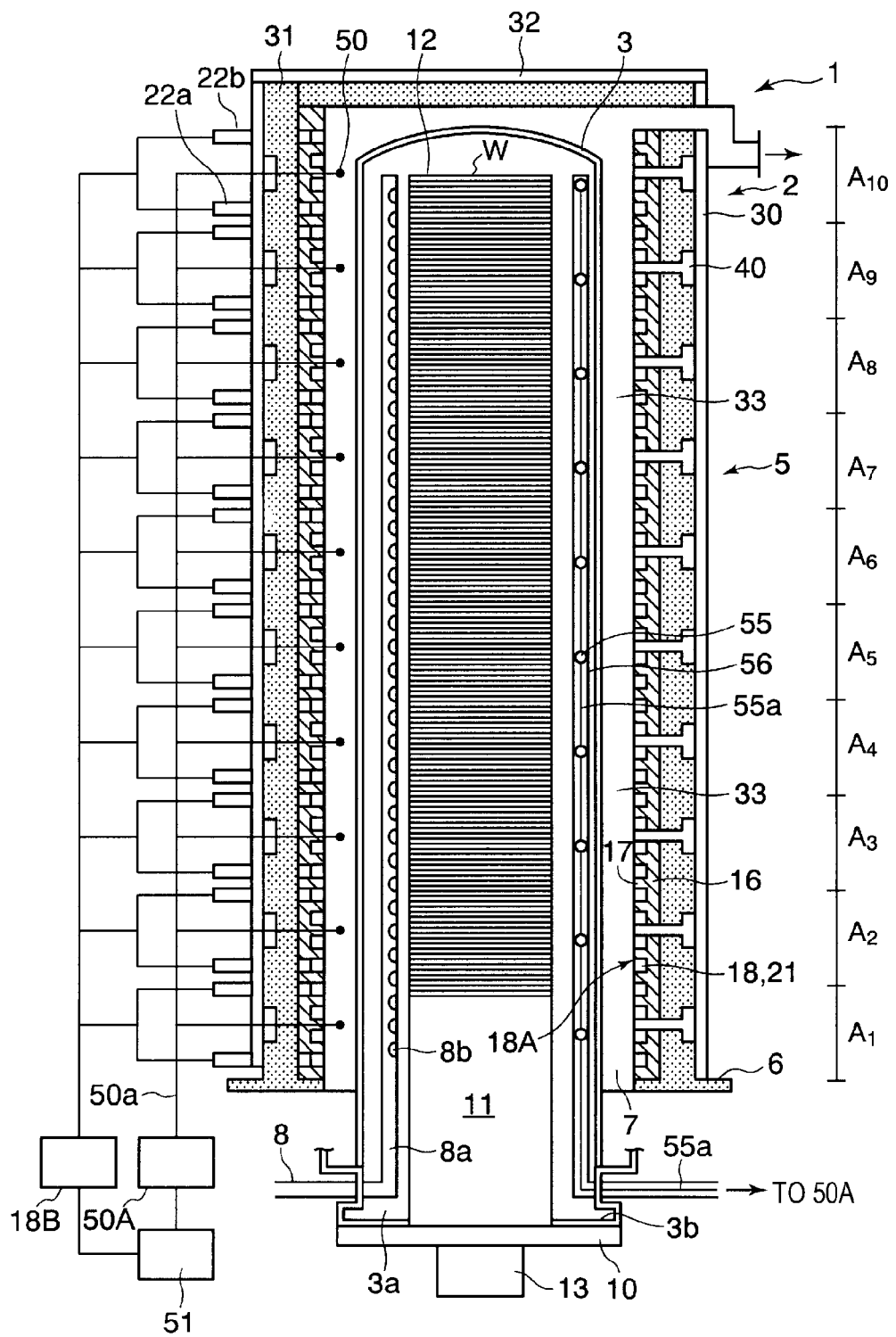
FIG. 1 is a longitudinal sectional view schematically illustrating a heat treatment apparatus according to some embodiments.

FIG. 1 is a longitudinal sectional view schematically illustrating showing an embodiment of a heat treatment apparatus according to some embodiments. In FIG. 1, a vertical heat treatment apparatus 1 includes a vertical heat treatment furnace 2 that receives a plurality of objects to be processed, for example, a plurality of semiconductor wafers "W." The vertical heat treatment apparatus 1 may perform heat treatments such as oxidation, diffusion, decompression, and CVD, at one time. The heat treatment furnace 2 includes a furnace body 5 where a heat generation resistors ("heater") 18A are disposed at an inner circumference surface thereof, and a processing vessel 3 disposed inside the furnace body 5 forms a space 33 between the furnace body 5 and the processing vessel 3. Further, the heat treatment furnace 2 receives and performs heat treatments to the plurality of wafers "W."

Moreover, the space 33 between the furnace body 5 and the processing vessel 3 is segmented into a plurality of unit regions (simply referred to as "regions"), for example, as ten unit regions "$A_1$, $A_2$, $A_3$, $A_4$, $A_5$, $A_6$, $A_7$, $A_8$, $A_9$, and $A_{10}$," along a longitudinal direction. The heater 18A is disposed in correspondence with each of the ten unit regions "$A_1$, ... $A_{10}$,"

and an in-furnace temperature sensor 50 for measuring a temperature in a corresponding unit region of the ten unit regions "$A_1, \ldots A_{10}$" is disposed in each of the ten unit regions "$A_1, \ldots A_{10}$." Furthermore, each of the in-furnace temperature sensors 50 is connected to a temperature calculating unit 50A through a signal line 50a which will be described in detail below.

As discussed above, the inside of the processing vessel 3 is also segmented into, for example, ten unit regions "$A_1, \ldots A_{10}$," and an in-vessel temperature sensor 55 in the processing vessel 3 for measuring a temperature in a corresponding unit region of the ten unit regions "$A_1, \ldots A_{10}$" is disposed in each of the ten unit regions "$A_1, \ldots A_{10}$." Each of the in-vessel temperature sensors 55 is supported by a temperature sensor supporting device 56 in the processing vessel 3, and is connected to the temperature calculating unit 50A through the signal line 55a.

Moreover, as shown in FIG. 1, the furnace body 5 is supported by a base plate 6, and the base plate 6 has an opening 7 into which the processing vessel 3 is inserted from a lower portion to an upper portion thereof. Also, an insulator is disposed in the opening 7 of the base plate 6 to cover a gap between the base plate 6 and the processing vessel 3.

The processing vessel 3 is formed of quartz, and has a lengthwise long cylindrical shape where an upper end portion thereof is closed and a lower end portion thereof is open as a furnace inlet 3a. An outward flange 3b is formed at the lower end portion of the processing vessel 3, and the flange 3b is supported on the base plate 6 through a flange pressure part. Also, an introduction port 8, i.e., an introduction hole, that transports treatment gas, inert gas or the like into the processing vessel 3, and an exhaust port, i.e., an exhaust hole, that exhausts gas inside the processing vessel 3 are disposed at a lower side portion of the processing vessel 3. A gas supply source may be connected to the introduction port 8 and an exhaust system which includes a vacuum pump for decompression control at, for example, about 133×600 Pa to about 133×10$^{-2}$ Pa may be connected to the exhaust port. Also, a gas supply pipe 8a is extending to the inside of the processing vessel 3 and is connected to the introduction port 8. Also, a gas supply hole 8b is formed in the gas supply pipe 8a.

Referring to FIG. 1, a cover 10, which closes the furnace inlet 3a of the processing vessel 3, is disposed under the processing vessel 3. The cover 10 may be able to be ascended/descended by an ascending/descending device. A heat insulation tube 11 is a heat insulation means for the furnace inlet 3a, and is mounted on the cover 10. Also, a boat 12 made of quartz, which may be used as a retention device, is mounted on the heat insulation tube 11, and the plurality of wafers "W" having, for example, a diameter of about 300 mm are vertically mounted at certain intervals on the boat 12. The number of wafers "W" may be between 100 and 150. A rotation device 13 is also provided to rotate the boat 12 about a shaft center thereof, and is disposed at the cover 10. The boat 12 may be unloaded from the inside of the processing vessel 3 to a lower loading area by the descending the cover 10, and may be loaded into the processing vessel 3 by the ascending the cover 10 after the wafers "W" are moved and switched in position.

The furnace body 5 also includes a cylindrical insulator 16 and a plurality of groove-shaped shelf parts 17 that are formed in multiple steps along an axial direction, i.e., a vertical direction, at an inner circumference surface of the insulator 16. A heater element (heater line and heat generation resistor) 18 is disposed at the furnace body 5 to form the heater 18A disposed in each of the unit regions "$A_1 \ldots A_{10}$" along each of the shelf parts 17. The insulator 16, for example, may be formed of an inorganic fiber including silica, alumina, or alumina silicate.

In the inner circumference surface of the cylindrical insulator 16, a ring-shaped groove portion 21 having the same center as that of the insulator 16 is formed in multiple steps along an axial direction, and the ring-shaped shelf parts 17 that circumferentially extends between an adjacent upper groove portion 21 and lower groove portion 21 are formed. In the groove portion 21, gaps are formed between an upper portion and a lower portion of the heater element 18 and between an inner wall of the groove portion 21 and the heater element 18, and the gaps sufficiently allow heat expansion, heat contraction and diametrical moving of the heater element 18. Further, in compulsory cooling, a cooling medium that flows from a cooling medium introduction part 40 of the furnace body 5 to the inside of the space 33 is inputted at a rear surface of the heater element 18 by the gaps. Such structure allows an efficient cooling of the heater element 18. Further, the air or nitrogen gas is used as the cooling medium.

In the heater 18A, the heater element 18 which forms the heater 18A is joined to a plurality of terminal plates 22a and 22b, and is connected to an external heater output unit 18B through the terminal plates 22a and 22b which are disposed to pass through the insulator 16 in a diametrical direction.

In order to maintain the shape of the insulator 16 of the furnace body 5 and to reinforce the insulator 16, as shown in FIG. 1, an outer circumference surface of the insulator 16 may be coated with a metal material such as an outer shell 30 which is made of stainless steel. It will be appreciated that other metal materials may be possible. An upper insulator 31 covering the outer shell 30 is disposed on the top of the insulator 16, and a ceiling plate 32 made of stainless steel that covers a top portion, i.e., an upper end portion, of the outer shell 30 is disposed at an upper portion of the upper insulator 31.

Although a belt-shaped heat generation resistor is described as the heater element 18 placed in the shelf part 17, the heater element 18 is not limited to the structure. The heater element 18 may be provided in various structures.

Moreover, as described above, the space between the furnace body 5 and the processing vessel 3 is segmented into ten unit regions "$A_1, A_2, A_3, A_4, A_5, A_6, A_7, A_8, A_9$, and $A_{10}$," and the temperature sensor (in-furnace temperature sensor) 50 for measuring a temperature in a corresponding unit region of the ten unit regions "$A_1, \ldots A_{10}$" is disposed in each of the ten unit regions "$A_1, \ldots A_{10}$." A detection signal from the temperature sensor 50 is transmitted to the temperature calculating unit 50A through the signal line 50a which will be described below, and the temperature calculating unit 50A calculates an in-furnace temperature. Furthermore, the in-furnace temperature calculated by the temperature calculating unit 50A is transmitted to a control device 51. In this case, the temperature calculating unit 50A acts as the in-furnace temperature calculating unit 50A that detects the temperature in the space 33 between the furnace body 5 and the processing vessel 3.

The temperature sensor 50, disposed in each of the unit regions "$A_1, \ldots A_{10}$," is connected to the temperature calculating unit 50A. The temperature calculating unit 50A will now be described in detail.

The temperature sensor 50, as described above, is disposed in each of the unit regions "$A_1, \ldots A_{10}$" in the space 33, and detects a temperature in each of the unit regions "$A_1, \ldots A_{10}$." The detection signal detected by the temperature sensor 50 in each of the unit regions "$A_1, \ldots A_{10}$" is transmitted to the temperature calculating unit 50A through the signal line 50a, and thus, an in-furnace temperature in each of the unit regions "$A_1, \ldots A_{10}$" is calculated. Then, the in-furnace temperature calculated by the temperature calculating unit 50A is transmitted to the control device 51. In a temperature rising operation, a temperature falling operation, or a temperature stabilizing operation, the control device 51 shortens a convergence time for a predetermined target temperature, and also approximates a temperature to the target temperature at a high precision.

Next, the in-furnace temperature sensor 50 disposed in each of the unit regions "$A_1, \ldots A_{10}$" in the space 33 and the temperature calculating unit 50A that calculates an in-furnace temperature based on the signal from the in-furnace temperature sensor 50 will be below described in detail with reference to FIG. 4.

As shown in FIG. 4, the lowermost unit region $A_1$ of the unit regions "$A_1, \ldots A_{10}$" is a reference region, and the other unit regions "$A_2, \ldots A_{10}$" are other regions. Also, in FIG. 4, the unit regions $A_1, A_2, A_3$, and $A_4$ will be described in detail below, and the unit regions $A_5, A_6, A_7, A_8, A_9$, and $A_{10}$ also have approximately the same configuration as that of the other regions "$A_2, A_3$, and $A_4$" other than the reference region $A_1$.

The in-furnace temperature sensor 50 in the reference region "$A_1$" includes a first thermocouple 81 having expensive thermocouples such as the R thermocouple or the S thermocouple where the change of the Seebeck coefficient is small even under a heat history, and a second thermocouple 82 having inexpensive thermocouples such as a N thermocouple, a K thermocouple, an E thermocouple, or a J thermocouple other than the expensive R thermocouple or S thermocouple. Also, for convenience, in FIG. 4, the R thermocouple is illustrated as the first thermocouple 81, and the K thermocouple is illustrated as the second thermocouple. However, the R thermocouple and the K thermocouple can be replaced with the other similar thermocouples as discussed above.

Moreover, the in-furnace temperature sensor 50 in each of the other regions $A_2, A_3, A_4, A_5, A_6, A_7, A_8, A_9$, and $A_{10}$ includes the second thermocouple 82 having the inexpensive N thermocouple, K thermocouple, or E thermocouple.

Here, the characteristics of the R thermocouple and S thermocouple forming the first thermocouple 81 and the characteristics of the N thermocouple, K thermocouple, E thermocouple, and J thermocouple forming the second thermocouple are shown in Table 1 below.

Table 1 shows the types and characteristics of standard thermocouples.

TABLE 1

| Types | Materials | Characteristics |
|---|---|---|
| R | + Pt—13Rh<br>− Pt | The R thermocouple and the S thermocouple are suitable for an oxidative or inert atmosphere from about 0 to about 1480 degrees C. |
| S | + Pt—10Rh<br>− Pt | The R thermocouple and the S thermocouple are unsuitable for an atmosphere including a metal vapor or a reduction atmosphere.<br>A Pt-based thermocouple cannot be used when it is directly inserted into a metal protection pipe. Accordingly, the use of the sheath type R and S thermocouples is not suggested. The NCF600 sheath type exists as a product, but a service life is very short at about 1000 degrees C. or more. |
| N | + Ni—14.2Cr—1.4Si<br>− Ni—4.4Si—0.15Mg | The N thermocouple has been developed for solving problems of the K thermocouple. By increasing Si on lines of +/− both sides and increasing an amount of Cr of the + side, an oxidation resistance has been improved at a high temperature, and a short range ordering properties have been reduced. |
| K | + Ni—10Cr<br>− Ni—2Al—2Mn—1Si | The K thermocouple is suitable for an oxidative or inert atmosphere up to about 1260 degrees C.<br>The K thermocouple is not suitable for a high-temperature reduction atmosphere, and causes the large decrease in an EMF within a very short period of time because a green rot corrosion occurs depending on the case. Since the K thermocouple has Ni as a main component, the K thermocouple is not suitable for an atmosphere including sulfur. Since the K thermocouple causes an increase in a reversible EMF called a short range ordering within a temperature range of about 250 to about 600 degrees C., a close attention is required when changing an insertion depth or performing a correction after its use. |
| E | + Ni—10Cr<br>− Cu—45Ni | The E thermocouple is suitable for an oxidative or inert atmosphere from about −200 to about 900 degrees C.<br>The E thermocouple is not suitable for a reduction atmosphere. The E thermocouple is suitable for a measurement at a low temperature below 0 degrees C. |
| J | + 99.5Fe<br>− Cu—45Ni | The J thermocouple is suitable for oxidative, reduction, and inert atmospheres from 0 to 760 degrees C.<br>Since the oxidation of Fe of the + side becomes faster at 540 degrees C. or more, the use of a thick line is required. The use of the J thermocouple is unsuitable at about 0 degree C. or lower. |

Moreover, the temperature calculating unit 50A includes an electromotive force difference circuit 83 and a first thermocouple electromotive force measurement circuit 84. The electromotive force difference circuit 83 is connected to the second thermocouple 82 in the reference region $A_1$ and the second thermocouple 82 in the other regions "$A_2, \ldots A_{10}$" through a cold junction 90, and calculates temperature differences between the reference region $A_1$ and the other regions "$A_2, \ldots A_{10}$." Further, the first thermocouple electromotive force measurement circuit 84 is connected to the first thermocouple in the reference region $A_1$ and calculates the temperature in the reference region $A_1$ based on the signal from the first thermocouple 81.

The signal from the first thermocouple electromotive force measurement circuit 84 is transduced into a signal for the second thermocouple by a first transducer 85. Thereafter, an adder 86 adds the transduced signal to the signal from the electromotive force difference circuit 83 corresponding to each of the other regions "$A_2, \ldots A_{10}$," thereby calculating the temperature in each of the other regions "$A_2, \ldots A_{10}$."

Further, as shown in FIG. 4, the first thermocouple 81 includes a wiring "R-TC$^+$" on the plus side and a wiring "R-TC$^-$" on the minus side, and the second thermocouple 82 includes a wiring "K-TC$^+$" on a plus side and a wiring "K-TC$^-$" on the minus side.

The following description will be made on an operation of the heat treatment apparatus according to some embodiments.

First, the wafers "W" are mounted into the boat 12 and the boat 12 having the wafers "W" is mounted on the heat insulation tube 11 of the cover 10. Then, the boat 12 is loaded into the processing vessel 3 by ascending the cover 10.

Subsequently, the control device 51 controls the output of the heater 18A in each of the unit regions "$A_1, \ldots A_{10}$" by heating the space 33 between the furnace body 5 and the processing vessel 3 using the heater output unit 18B. Then, a necessary heat treatment is performed on the wafers "W" inside the processing vessel 3.

In the meantime, the detection signal detected by the temperature sensor 50 in each of the unit regions "$A_1, \ldots A_{10}$" is transmitted to the temperature calculating unit 50A through the signal line 50a, and the temperature calculating unit 50A calculates an in-furnace temperature in each of the unit regions "$A_1, \ldots A_{10}$." The in-furnace temperature calculated by the temperature calculating unit 50A is transmitted to the control device 51.

The control device 51 controls the output of the heater output unit 18B based on the in-furnace temperature in each of the unit regions "$A_1, \ldots A_{10}$," and is electrically connected to the heater element 18 of the heater 18A in each of the unit regions "$A_1, \ldots A_{10}$."

The following description will be made in detail on a temperature measuring method of the temperature calculating unit 50A.

First, as shown in FIG. 4, a corresponding electromotive force difference circuit 83 calculates temperature differences between the reference region $A_1$ and the other regions "$A_2, \ldots A_{10}$" by using the signal from the second thermocouple 82 in the reference region "$A_1$" and the signal from the second thermocouple 82 in each of the other regions "$A_2, \ldots A_{10}$." Specifically, each electromotive force difference circuit 83 calculates a cold junction compensation value of an electromotive force difference of a K-TC electromotive force. Here, the cold junction compensation value is obtained from a difference of a cold junction corrected electromotive force.

Subsequently, the first thermocouple electromotive force measurement circuit 84 calculates the temperature in the reference region $A_1$ based on the signal from the first thermocouple 81 in the reference region $A_1$. Specifically, the first thermocouple electromotive force measurement circuit 84 calculates the cold junction compensation value of the R-TC electromotive force.

Subsequently, the signal indicating the R-TC electromotive force from the first thermocouple electromotive force measurement circuit 84 is transduced into a signal indicating the K-TC electromotive force for the second thermocouple by the first transducer 85. The adder 86 adds the transduced signal and the signal from the electromotive force difference circuit 83 corresponding to each of the other regions "$A_2, \ldots A_{10}$."

Subsequently, the signal indicating the K-TC electromotive force added by the adder 86 is input to a temperature transducer 87. The temperature transducer 87 calculates the temperature corresponding to each of the other regions "$A_2, \ldots A_{10}$."

In other words, the signal indicating the R-TC electromotive force from the first thermocouple electromotive force measurement circuit 84 is input to the temperature transducer 87. In the meantime, the temperature transducer 87 calculates the temperature corresponding to the reference region $A_1$.

In this way, according to some embodiments, the expensive first thermocouple 81 is disposed only in the reference region "$A_1$" where a change in Seebeck coefficient is small, and the inexpensive second thermocouple 82 is disposed in the reference region "$A_1$" and other regions "$A_2, \ldots A_{10}$." That is, the temperature in the reference region "$A_1$" is calculated by using the first thermocouple 81, and temperatures in the other regions "$A_2, \ldots A_{10}$" are calculated based on the temperature in the reference region "$A_1$." Further, the electromotive force difference circuit 83 corresponding to each of the other regions "$A_2, \ldots A_{10}$" calculates temperature differences between the reference region "$A_1$" and the other regions "$A_2, \ldots A_{10}$." Accordingly, the installing costs of the thermocouples 81 and 82 can be reduced.

As described above, the control device 51 separately controls the respective heaters 18A in the unit regions "$A_1, \ldots A_{10}$" by controlling the output of the heater output unit 18A. Thus, as shown in FIG. 2, the control device may easily tune a control parameter at $T_1$ during rising and falling of the temperature. Also, as shown in FIG. 3, the control device 51 may carefully and thoroughly be able to control the space 33 between the furnace body 5 and the processing vessel 3 at $T_2$, thereby stabilizing the temperature thereof.

The following description will be made in detail with reference to FIG. 5 according to some embodiments.

As illustrated in FIG. 5, the lowermost unit region $A_1$ of the unit regions "$A_1, \ldots A_{10}$" is a reference region, and the remaining unit regions "$A_2, \ldots A_{10}$" are other regions. Also, in FIG. 5, the unit regions "$A_1, A_2, A_3$, and $A_4$" of the unit regions "$A_1, \ldots A_{10}$" are described in detail, but the unit regions "$A_5, A_6, A_7, A_8, A_9$, and $A_{10}$" also has the similar configuration as that of the other regions "$A_2, A_3$, and $A_4$" other than the reference region $A_1$.

The in-furnace temperature sensor 50 in the reference region $A_1$ includes the first thermocouple 81 formed of the expensive R thermocouple or S thermocouple where the change of the Seebeck coefficient is small even under a heat history, and the second thermocouple 82 formed of the inexpensive N thermocouple, K thermocouple, E thermocouple, or J thermocouple other than the expensive R thermocouple or S thermocouple. Also, for convenience, in FIG. 5, the R thermocouple is illustrated as the first thermocouple 81, and the K thermocouple is illustrated as the second thermocouple. However, the R thermocouple and the K thermocouple can be replaced with the other thermocouples as discussed above.

Moreover, the in-furnace temperature sensor 50 in each of the other regions "$A_2, A_3, A_4, A_5, A_6, A_2, A_8, A_9$, and $A_{10}$" includes the second thermocouple 82 having the inexpensive N thermocouple, K thermocouple, E thermocouple or the like.

Moreover, the temperature calculating unit 50A includes the electromotive force difference circuit 83 and the first thermocouple electromotive force measurement circuit 84. The electromotive force difference circuit 83 is connected to the second thermocouple 82 in the reference region $A_1$ and the second thermocouple 82 in the other regions "$A_2, \ldots A_{10}$" through the cold junction 90 and calculates temperature differences between the reference region $A_1$ and the other regions "$A_2, \ldots A_{10}$." Further, the first thermocouple electromotive force measurement circuit 84 that is connected to the first thermocouple 81 in the reference region $A_1$, and calculates the temperature in the reference region $A_1$ on the basis of a signal from the first thermocouple 81.

The signal from the first thermocouple electromotive force measurement circuit 84 is transmitted to the adder 86. The signal from the electromotive force difference circuit 83 corresponding to each of the other regions "$A_2, \ldots A_{10}$" is transduced into a signal for the first thermocouple 81 by a second transducer 89. Then, the adder 86 adds the signal from the first thermocouple electromotive force measurement circuit 84 and the signal from the second transducer 89 to calculate the temperature in each of the other regions "$A_2, \ldots A_{10}$."

In FIG. 5, the first thermocouple 81 includes a wiring "R-TC$^+$" on the plus side and a wiring "R-TC$^-$" on the minus side, and the second thermocouple 82 includes a wiring "K-TC$^+$" on the plus side and a wiring "K-TC$^-$" on the minus side.

The following description will be made in detail with reference to FIG. 5 on a temperature measuring method of the temperature calculating unit 50A in the furnace.

First, as illustrated in FIG. 5, a corresponding electromotive force difference circuit 83 calculates temperature differences between the reference region $A_1$ and the other regions "$A_2, \ldots A_{10}$," by using the signal from the second thermocouple 82 in the reference region $A_1$ and the signal from the second thermocouple 82 in each of the other regions "$A_2, \ldots A_{10}$." Specifically, each electromotive force difference circuit 83 calculates a cold junction compensation value of the electromotive force difference of the K-TC electromotive force.

Subsequently, the first thermocouple electromotive force measurement circuit 84 calculates the temperature in the reference region $A_1$ based on the signal from the first thermocouple 81 in the reference region $A_1$. Specifically, the first thermocouple electromotive force measurement circuit 84 calculates the cold junction compensation value of the R-TC electromotive force.

Subsequently, a signal indicating the R-TC electromotive force from the first thermocouple electromotive force measurement circuit 84 is transmitted to the adder 86. Also, the signal indicating the K-TC electromotive force from the electromotive force difference circuit 83 corresponding to each of the other regions "$A_2, \ldots A_{10}$" is transduced into a signal indicating the R-TC electromotive force for the first thermocouple 81 by the second transducer 89. The adder 86 adds the signal from the second transducer 89 and the signal from the first thermocouple electromotive force measurement circuit 84.

Subsequently, a signal added by the adder 86, which indicates the K-TC electromotive force, is inputted to a temperature transducer 87. The temperature transducer 87 calculates a temperature corresponding to each of the other regions "$A_2, \ldots A_{10}$."

The signal indicating the R-TC electromotive force from the first thermocouple electromotive force measurement circuit 84 is input to the temperature transducer 87. The temperature transducer 87 calculates a temperature corresponding to the reference region $A_1$.

In this way, according to some embodiments, the expensive first thermocouple 81 is disposed only in the reference region $A_1$ where a change in Seebeck coefficient is small, and the inexpensive second thermocouple 82 is disposed in each of the reference region $A_1$ and other regions "$A_2, \ldots A_{10}$." That is, the temperature in the reference region "$A_1$" is calculated by using the first thermocouple 81, and temperatures in the other regions "$A_2, \ldots A_{10}$" are calculated based on of the temperature in the reference region "$A_1$." Further, the electromotive force difference circuit 83 corresponding to each of the other regions "$A_2, \ldots A_{10}$" calculates temperature differences between the reference region $A_1$ and the other regions "$A_2, \ldots A_{10}$." Accordingly, the installing costs of the thermocouples 81 and 82 can be reduced.

<Modified Example of Heat Treatment Apparatus According to Some Embodiments>

The following description will be made on a modified example of the heat treatment apparatus according to some embodiments.

In the above-described embodiment, the temperature calculating unit 50A calculates the in-furnace temperature based on the signal from the in-furnace temperature sensor 50 disposed in each of the unit regions "$A_1, \ldots A_{10}$" in the space 33 between the furnace body 5 and the processing vessel 3. However, the present disclosure is not limited thereto. The temperature calculating unit 50A may calculate the temperature in the processing vessel 3 based on the signal from the in-vessel temperature sensor 55 disposed in each of the unit regions "$A_1, \ldots A_{10}$" in the processing vessel 3. In this case, the temperature calculating unit 50A may act as an in-vessel temperature calculating unit.

In other words, as described above, the inside of the processing vessel 3 is segmented into the ten unit regions "$A_1, \ldots A_{10}$," and the in-vessel temperature sensor 55 for detecting the temperature in the corresponding unit region of the unit regions "$A_1, \ldots A_{10}$" is disposed in each of the unit regions "$A_1, \ldots A_{10}$." Further, the detection signal from the in-vessel temperature sensor 55 is transmitted to the temperature calculating unit 50A through the signal line 55a, which will be described below, and the temperature calculating unit 50A calculates an in-furnace temperature. Furthermore, the in-furnace temperature calculated by the temperature calculating unit 50A is transmitted to the control device 51. Also, the in-vessel temperature sensor 55 disposed in each of the unit regions "$A_1, \ldots A_{10}$" is supported by the in-vessel temperature sensor supporting device 56.

The following description will be made with reference to FIG. 6 on a heat treatment apparatus according to some embodiments. FIG. 6 is a view schematically illustrating a modified heat treatment apparatus according to some embodiments.

The heat treatment apparatus of FIG. 6 includes a processing vessel 3 having a structure that differs from the structure of the processing vessel 3 of the heat treatment apparatus of FIGS. 1 to 5, but other elements besides the processing vessel 3 in FIG. 6 are similar as those of the heat treatment apparatus of FIGS. 1 to 5.

That is, in FIG. 1, although the processing vessel 3 is configured with a single shell pipe, the present disclosure is not limited thereto. The processing vessel 3 may have double shell pipe structure having an external tube 3A and an internal tube 3B disposed inside the external tube 3A.

In the heat treatment apparatus of FIG. 6, the same elements as those of the heat treatment apparatus of FIGS. 1 to 5 are respectively indicated by the same reference numerals, and their detailed description is not provided.

Moreover, in the above-described embodiment, the space 33 between the furnace body 5 and the processing vessel 3 are segmented into the ten unit regions "$A_1, \ldots A_{10}$" and the inside of the processing vessel 3 are segmented into the ten unit regions "$A_1, \ldots A_{10}$," but the present disclosure is not limited thereto. For instance, the space 33 and the inside of the processing vessel 3 may be segmented into an arbitrary number of unit regions, where the arbitrary number is more than three. In this case, as the number of unit regions increases, the effect of the present disclosure is more enhanced.

Moreover, in the above embodiments, the space 33 and the inside of the processing vessel 3 are segmented with an equal interval, but the present disclosure is not limited thereto. That is, even if the width, position or shape of the unit region is variously changed according to the application of the apparatus, the effect of the present disclosure is not changed.

According to some embodiments, the expensive first thermocouple and the inexpensive second thermocouple are used as the in-vessel temperature sensor or the in-furnace temperature sensor in the reference region. Further, the inexpensive second thermocouple is used as the in-vessel temperature sensor or the in-furnace temperature sensor in the other region, and the electromotive force difference circuit calculates the electromotive force difference based on the signal from the first thermocouple in the reference region and the signal from the second thermocouple in the other region. Subsequently, the temperature in the reference region is measured based on the signal from the first thermocouple in the reference region, and the adder provides the temperature in the other region based on the signal from the first thermocouple and the signal from the electromotive force difference circuit in the other region. Accordingly, the expensive first thermocouple is not required to be disposed in the every unit region and the signal from the second thermocouple in each region is not required to be calibrated, thereby reducing the installing cost.

While certain embodiments have been described, these embodiments have been presented by way of example only, and are not intended to limit the scope of the disclosures. Indeed, the novel methods, systems, methods, devices, described herein may be embodied in a variety of other forms or may be combined; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus comprising:
a furnace body including a heating part disposed at an inner circumference surface thereof;
a processing vessel disposed in the furnace body, and configured to receive a plurality of objects to be processed, wherein a space having a plurality of regions is formed between the furnace body and the processing vessel;
an in-furnace temperature sensor disposed corresponding to each of the plurality of regions in the space, wherein the plurality of regions includes a reference region and other region;
an in-furnace temperature calculating unit configured to calculate an in-furnace temperature based on signals from each of the in-furnace temperature sensors; and
a control unit configured to control the heating part based on the in-furnace temperature calculated by the in-furnace temperature calculating unit,
wherein the in-furnace temperature sensor disposed in the reference region includes:
a first thermocouple formed of an R thermocouple or an S thermocouple; and
a second thermocouple formed of a thermocouple other than the R thermocouple or the S thermocouple,
wherein the in-furnace temperature sensor disposed in the other region includes the second thermocouple, and the other region corresponds to the plurality of regions excluding the reference region, and
wherein the in-furnace temperature calculating unit includes:
an electromotive force difference circuit connected to the second thermocouple in the reference region and the second thermocouple in the other region, and configured to calculate a temperature difference between the reference region and the other region;
a first thermocouple electromotive force measurement circuit connected to the first thermocouple in the reference region, and configured to calculate a temperature in the reference region based on a first signal from the first thermocouple; and
an adder connected to the first thermocouple electromotive force measurement circuit and the electromotive force difference circuit corresponding to the other region, and configured to add a second signal from the first thermocouple electromotive force measurement circuit to a third signal from the electromotive force difference circuit to calculate a temperature in the other region.

2. The heat treatment apparatus of claim 1, wherein the in-furnace temperature calculating unit further includes a first transducer to transduce the second signal into a fourth signal for the second thermocouple, and
wherein the adder adds the fourth signal from the first transducer to the third signal to calculate the temperature in the other region.

3. The heat treatment apparatus of claim 1, wherein the in-furnace temperature calculating unit further includes a second transducer to transduce the third signal into a fifth signal for the first thermocouple, and
wherein the adder adds the second signal to the fifth signal from the second transducer corresponding to the other region to calculate the temperature in the other region.

4. A heat treatment apparatus comprising:
a furnace body including a heating part disposed at an inner circumference surface thereof;
a processing vessel disposed in the furnace body, having a plurality of regions formed therein, and configured to receive a plurality of objects to be processed, wherein a space is formed between the furnace body and the processing vessel;
an in-vessel temperature sensor disposed corresponding to each of the plurality of regions of the processing vessel, wherein the plurality of regions includes a reference region and other region;
an in-vessel temperature calculating unit configured to calculate an in-vessel temperature based on signals from each of the in-vessel temperature sensors; and
a control unit configured to control the heating part based on the in-vessel temperature calculated by the in-vessel temperature calculating unit,
wherein the in-vessel temperature sensor disposed in the reference region of the processing vessel includes:
a first thermocouple formed of an R thermocouple or an S thermocouple; and a second thermocouple formed of a thermocouple other than the R thermocouple or the S thermocouple, wherein the in-vessel temperature sensor disposed in the other region includes the second thermocouple, and the other region corresponds to the plurality of regions excluding the reference region, and wherein the in-vessel temperature calculating unit includes:

an electromotive force difference circuit connected to the second thermocouple in the reference region and the second thermocouple in the other region, and configured to calculate a temperature difference between the reference region and the other region;

a first thermocouple electromotive force measurement circuit connected to the first thermocouple in the reference region, and configured to calculate a temperature in the reference region based on a first signal from the first thermocouple; and an adder connected to the first thermocouple electromotive force measurement circuit and the electromotive force difference circuit corresponding to the other region and configured to add a second signal from the first thermocouple electromotive force measurement circuit to a third signal from the electromotive force difference circuit to calculate a temperature in the other region.

5. The heat treatment apparatus of claim 4, wherein the in-vessel temperature calculating unit further includes a first transducer to transduce the second signal into a fourth signal for the second thermocouple, and wherein the adder adds the fourth signal from the first transducer to the third signal to calculate the temperature in the other region.

6. The heat treatment apparatus of claim 4, wherein the in-vessel temperature calculating unit further includes a second transducer to transduce the third signal into a fifth signal for the first thermocouple, and wherein the adder adds the second signal to the fifth signal from the second transducer corresponding to the other region to calculate the temperature in the other region.

7. A temperature measuring method of a heat treatment apparatus, the method comprising:

receiving, via an in-furnace temperature calculating unit of the heat treatment apparatus, a plurality of signals from a plurality of in-furnace temperature sensors, wherein the plurality of in-furnace temperature sensors are disposed corresponding to a plurality of regions in a space formed between a furnace body and a processing vessel of the heat treatment apparatus, the plurality of regions includes a reference region and other region, the in-furnace temperature sensors disposed in the reference region includes a first thermocouple formed of an R thermocouple or a S thermocouple, and a second thermocouple formed of a thermocouple other than the R thermocouple or the S thermocouple, and the in-furnace temperature sensors disposed in the other region include the second thermocouple;

calculating, via an electromotive force difference circuit of the in-furnace temperature calculating unit, a temperature difference between the reference region and the other region based on a first signal from the second thermocouple in the reference region and a second signal from the second thermocouple in the other region, and outputting a fourth signal based on the calculated temperature difference;

calculating, via a first thermocouple electromotive force measurement circuit of the in-furnace temperature calculating unit, a temperature in the reference region based on a third signal from the first thermocouple in the reference region, and outputting a fifth signal based on the calculated temperature in the reference region; and receiving and adding, via an adder of the in-furnace temperature calculating unit, the fourth signal and the fifth signal to calculate a temperature in the other region.

8. The temperature measuring method of claim 7, further comprising:

transducing, via a first transducer of the in-furnace temperature calculating unit, the fifth signal into a sixth signal for the second thermocouple; and adding, via the adder, the sixth signal from the first transducer to the fourth signal to calculate the temperature in the other region.

9. The temperature measuring method of claim 7, further comprising:

transducing, via a second transducer of the in-furnace temperature calculating unit, the fourth signal into a seventh signal for the first thermocouple; and adding, via the adder, the seventh signal from the second transducer to the fifth signal to calculate the temperature in the other region.

10. A temperature measuring method of a heat treatment apparatus, the method comprising:

receiving, via an in-vessel temperature calculating unit of the heat treatment apparatus, a plurality of signals from a plurality of in-vessel temperature sensors, wherein the plurality of in-vessel temperature sensors are disposed corresponding to each of a plurality of regions of a processing vessel, and a space is formed between a furnace body and the processing vessel of the heat treatment apparatus, the plurality of regions includes a reference region and other region, an in-vessel temperature sensor disposed in the reference region includes a first thermocouple formed of an R thermocouple or a S thermocouple, and a second thermocouple formed of a thermocouple other than the R thermocouple or the S thermocouple, and an in-vessel temperature sensor disposed in the other region includes the second thermocouple;

calculating, via an electromotive force difference circuit of the in-vessel temperature calculating unit, a temperature difference between the reference region and the other region based on a first signal from the second thermocouple in the reference region and a second signal from the second thermocouple in the other region, and outputting a fourth signal based on the calculated temperature difference;

calculating, via a first thermocouple electromotive force measurement circuit of the in-vessel temperature calculating unit, a temperature in the reference region based on a third signal from the first thermocouple in the reference region, and outputting a fifth signal based on the calculated temperature in the reference region; and receiving and adding, via an adder of the in-vessel temperature calculating unit, the fourth signal and the fifth signal to calculate a temperature in the other region.

11. The temperature measuring method of claim 10, further comprising:

transducing, via a first transducer of the in-furnace temperature calculating unit, the fifth signal into a sixth signal for the second thermocouple, and adding, via the adder, the sixth signal from the first transducer to the fourth signal to calculate the temperature in the other region.

12. The temperature measuring method of claim 10, further comprising:

transducing, via a second transducer of the in-furnace temperature calculating unit, the fourth signal into a seventh signal for the first thermocouple, and adding, via the adder, the seventh signal from the second transducer to the fifth signal to calculate the temperature in the other region.

\* \* \* \* \*